United States Patent
Chen et al.

(10) Patent No.: US 9,105,730 B2
(45) Date of Patent: Aug. 11, 2015

(54) THIN FILM TRANSISTOR AND FABRICATION METHOD THEREOF

(71) Applicant: E Ink Holdings Inc., Hsinchu (TW)

(72) Inventors: Wei-Tsung Chen, Hsinchu (TW);
Ted-Hong Shinn, Hsinchu (TW);
Chuang-Chuang Tsai, Hsinchu (TW);
Chih-Hsiang Yang, Hsinchu (TW);
Chia-Chun Yeh, Hsinchu (TW);
Wen-Chung Tang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 112 days.

(21) Appl. No.: 14/085,813

(22) Filed: Nov. 21, 2013

(65) Prior Publication Data

US 2014/0138677 A1    May 22, 2014

(30) Foreign Application Priority Data

Nov. 21, 2012    (TW) .............................. 101143453 A

(51) Int. Cl.
*H01L 29/786* (2006.01)
*H01L 29/66* (2006.01)

(52) U.S. Cl.
CPC ...... *H01L 29/7869* (2013.01); *H01L 29/66969* (2013.01)

(58) Field of Classification Search
CPC ................. H01L 51/0508; H01L 2924/13069; H01L 29/4908
See application file for complete search history.

(56) References Cited

U.S. PATENT DOCUMENTS

| 5,821,622 | A | * | 10/1998 | Tsuji et al. ................... 257/763 |
| 6,063,654 | A | * | 5/2000 | Ohtani ......................... 438/166 |
| 7,145,174 | B2 | * | 12/2006 | Chiang et al. .................. 257/59 |
| 8,144,389 | B2 | * | 3/2012 | Oikawa et al. ................ 359/296 |
| 8,456,396 | B2 | * | 6/2013 | Umezaki ........................ 345/87 |
| 8,835,917 | B2 | * | 9/2014 | Yamazaki et al. .............. 257/43 |
| 2003/0186489 | A1 | * | 10/2003 | Ishikawa ....................... 438/155 |
| 2008/0105875 | A1 | * | 5/2008 | Maekawa et al. ............... 257/72 |
| 2009/0302321 | A1 | * | 12/2009 | Park et al. ...................... 257/66 |
| 2012/0061650 | A1 | * | 3/2012 | Yeh et al. ........................ 257/40 |

FOREIGN PATENT DOCUMENTS

| JP | 2009-176865 A | 8/2009 |
| JP | 2009-260002 A | 11/2009 |
| JP | 2010-135773 A | 6/2010 |

OTHER PUBLICATIONS

Light induced instabilities in amorphous indium—gallium—zinc—oxide thin-film transistorsMd Delwar Hossain Chowdhury, Piero Migliorato, and Jin Jang/Applied Physics Letters 97, 173506 (2010)/ /published online Oct. 28, 2010.

(Continued)

*Primary Examiner* — Evan Pert
*Assistant Examiner* — Gustavo Ramallo
(74) *Attorney, Agent, or Firm* — CKC & Partners Co., Ltd.

(57) ABSTRACT

A thin film transistor and a fabrication method thereof are provided. A metal patterning layer is formed on the metal oxide semiconductor layer of a thin film transistor to shield the metal oxide semiconductor layer from the water, oxygen and light in the environment.

20 Claims, 3 Drawing Sheets

(56) References Cited

OTHER PUBLICATIONS

Transition of dominant instability mechanism depending on negative gate bias under illumination in amorphous In—Ga—Zn—O thin film transistorHimchan Oh, Sung-Min Yoon, Min Ki Ryu, Chi-Sun Hwang, Shinhyuk Yang, and Sang-Hee Ko Park/ Applied Physics Letters 98, 033504 (2011)/published online Jan. 18, 2011.
Corresponding TW Office Action that these art references were cited.

* cited by examiner

THIN FILM TRANSISTOR AND FABRICATION METHOD THEREOF

CROSS-REFERENCE TO RELATED APPLICATION

This application claims the priority benefit of Taiwanese application serial no. 101143453, filed Nov. 21, 2012, the full disclosure of which is incorporated herein by reference.

BACKGROUND

1. Technical Field

The disclosure relates to a semiconductor device and a fabrication method thereof.

2. Description of Related Art

The metal oxide semiconductor material in thin film transistors (TFTs) of conventional liquid crystal displays (LCDs) mainly uses hydrogenated amorphous silicon (a-Si:H). Since some shortcomings of the a-Si:H, such as low carrier mobility (0.1-1.0 $cm^2$/Vs), light sensitivity, and low chemical stability, the a-Si:H has been replaced by low temperature polysilicon (LTPS). LTPS can improve the problem of the low carrier mobility to increase the carrier mobility to 100-200 $cm^2$/Vs, and also has good electrical stability. However, the LTPS still has shortcomings of drifted threshold voltage, complicated process, and expensive cost.

Recently, since transparent oxide semiconductor (TOS) has advantages of high transparency, wide band gaps, high carrier mobility, and easy preparation, TOS has become a widely studied object of scientists. When the TOS is applied on the metal oxide semiconductor layer of TFTs, in addition to increasing aperture ratio, improving utilization efficiency of backlights, and reducing power consumption, a single pixel area also can be reduced to increase the LCDs' resolution.

N type indium gallium zinc oxide (IGZO) is taken for example below. Comparing a-IGZO TFT and a-Si TFT, the carrier mobility of the a-IGZO TFT is 20-50 times of that of the a-Si TFT, and the conducting current is 20 times of that of the a-Si TFT. Therefore, the power consumption of the a-IGZO TFT is much less than that of the a-Si TFT.

However, the current studies show that the touch of water, oxygen and light on the a-IGZO thin film can affect the properties of TFT. Therefore, how to protect the a-IGZO thin film becomes an important issue. At present, the passivation layer of TFTs mostly uses a thin film of silicon oxide or silicon nitride to prevent the penetration of water and oxygen, and the irradiation of light. However, the thin film of silicon oxide or silicon nitride cannot effectively block the light in the visible to the UV region to irradiating on the a-IGZO thin film. Therefore, this becomes an urgent problem.

SUMMARY

In one aspect, the present invention is directed to a thin film transistor, which comprises a gate, a gate insulating layer, a metal oxide semiconductor layer, an insulating layer, a source, a drain, and a metal pattering layer. The metal oxide semiconductor layer is disposed on the gate insulating layer. The insulating layer is disposed on the metal oxide semiconductor layer. The source and the drain are respectively disposed on the two sides of the metal oxide semiconductor layer and connect to the metal oxide semiconductor layer. The metal pattering layer is disposed on the insulating layer. In addition, two openings are respectively located between the metal pattering layer and the source as well as the metal pattering layer and the drain to expose portions of the metal oxide semiconductor layer.

According to an embodiment, the exposed metal oxide semiconductor layer has a higher density of oxygen vacancy than the unexposed metal oxide semiconductor layer. Therefore, the exposed metal oxide semiconductor layer has a higher conductivity than the unexposed metal oxide semiconductor layer.

According to another embodiment, a passivation layer is further disposed to cover the thin film transistor.

In another aspect, a method of fabricating the thin film transistor above is provided. The gate, the gate insulating layer, the metal oxide semiconductor, the insulating layer, and a metal layer are sequentially formed on a substrate. The metal layer is then patterned to form a source and a drain respectively located on two sides of the metal oxide semiconductor layer, a metal pattering layer on the insulating layer, as well as two openings respectively located between the metal pattering layer and the source as well as the metal pattering layer and the drain to expose portions of the metal oxide semiconductor layer.

According to an embodiment, the passivation layer is further formed to cover the thin film transistor.

According to another embodiment, a thermal annealing process is performed before patterning the metal layer to treat the metal oxide semiconductor layer.

According to yet another embodiment, a thermal annealing process is performed between the steps of patterning the metal layer and forming the passivation layer to treat the metal oxide semiconductor layer.

In yet another aspect, an array substrate is provided. The array substrate comprises a substrate and the thin film transistor above disposed on the substrate.

In yet another aspect, a display device is provided. The display device comprises the array substrate above, an opposite substrate disposed opposite to the array substrate, and a display layer disposed between the array substrate and the opposite substrate.

The foregoing presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later. Many of the attendant features will be more readily appreciated as the same becomes better understood by reference to the following detailed description considered in connection with the accompanying drawings.

DETAILED DESCRIPTION

Figure 1A:
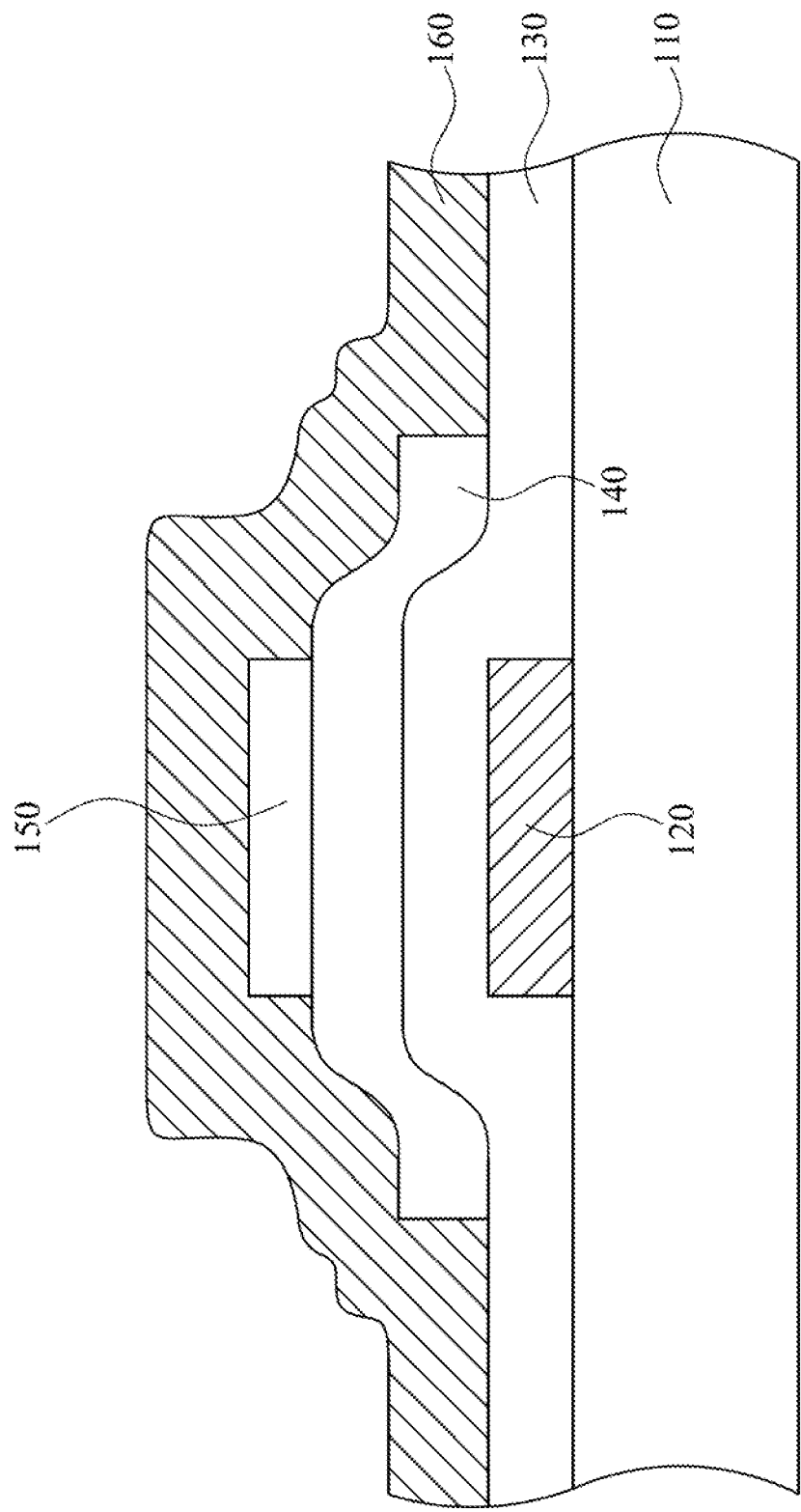
FIGS. 1A-1B are cross-sectional diagrams of a TFT fabrication process according to an embodiment of this invention.

In the following detailed description, for purposes of explanation, numerous specific details are set forth in order to provide a thorough understanding of the disclosed embodiments. It will be apparent, however, that one or more embodiments may be practiced without these specific details.

In other instances, well-known structures and devices are schematically shown in order to simplify the drawing.

Figure 1B:
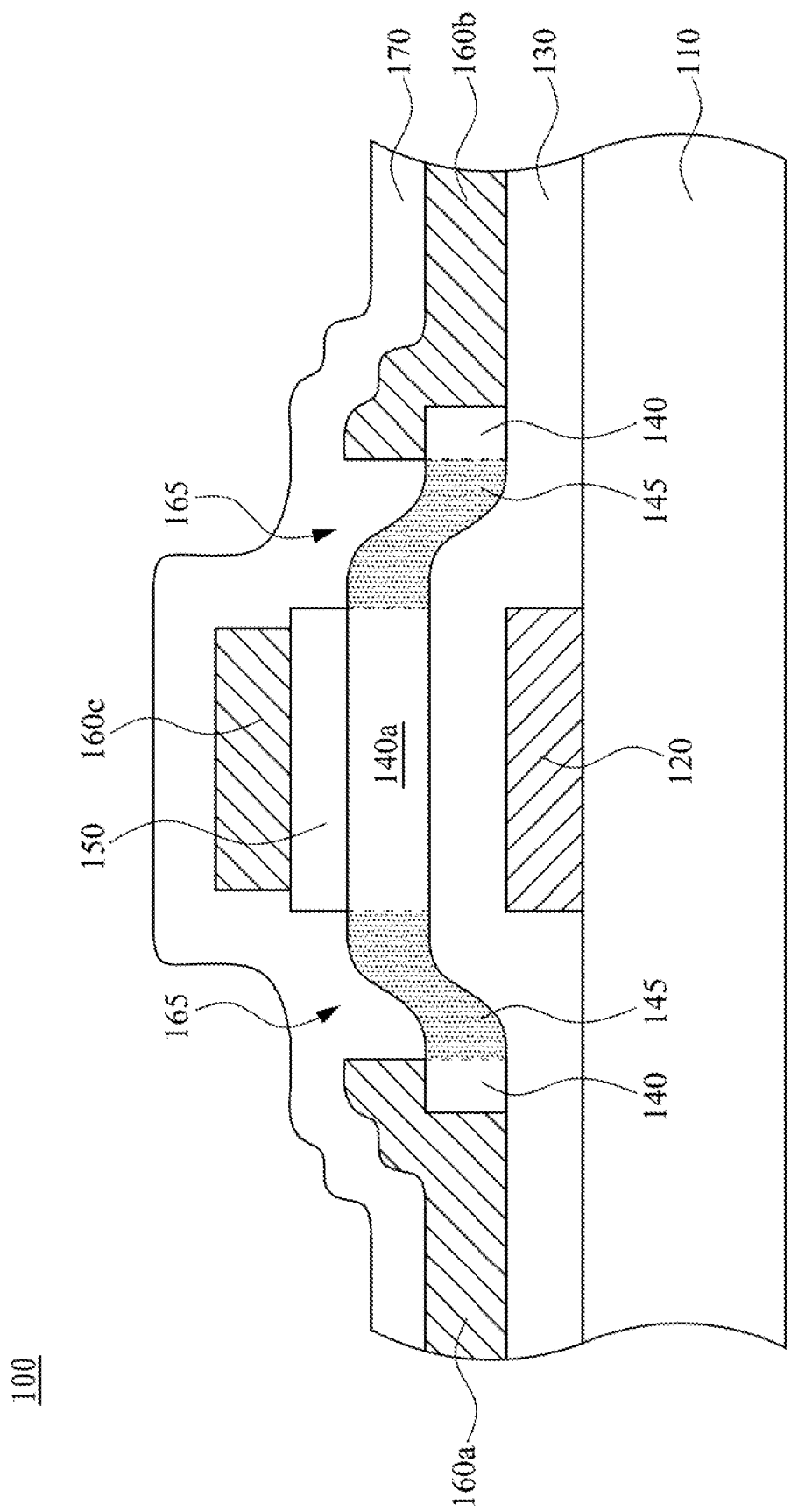

FIGS. 1A-1B are cross-sectional diagrams of a TFT fabrication process according to an embodiment of this invention. In FIG. 1A, a gate 120, a gate to insulating layer 130, a metal oxide semiconductor layer 140, an insulating layer 150, and a metal layer 160 are sequentially formed on a substrate 110. The metal oxide semiconductor layer 140 and the insulating layer 150 both are disposed right above the gate 120.

The gate 120 can be made from a doped semiconductor or a metal, for example. The gate 120 can be formed by chemical vapor deposition or physical vapor deposition, and then photolithography and etching, for example.

The gate insulating layer 130 can be made from silicon oxide, silicon nitride, or other metal oxide having a dielectric constant greater than the dielectric constant of silicon oxide. The gate insulating layer can be formed by chemical vapor deposition or physical vapor deposition.

The metal oxide semiconductor layer 140 can be indium gallium zinc oxide (IGZO), indium gallium oxide (IGO), or indium zinc oxide (IZO)). The metal oxide semiconductor layer can be formed by sputtering to form a metal oxide semiconductor film, and then by photolithography and etching to pattern the metal oxide semiconductor film to form the metal oxide semiconductor layer 140.

The insulating layer 150 can be made from silicon oxide, silicon nitride, or other useable insulating materials. The insulating layer 150 can be formed by chemical vapor deposition to form an insulating film, and then by photolithography and etching to pattern the insulating film to form the insulating layer 150.

The metal layer 160 can be made from Al, Cu, Ti, Mo, or a MoCr alloy. The metal layer 160 can be formed by physical vapor deposition.

In FIG. 1B, the metal layer 160 is patterned to form a source 160a and a drain 160b on two sides of the metal oxide semiconductor layer 140 and a metal patterning layer 160c on the insulating layer 150. The source 160a and the drain 160b both connect to the metal oxide semiconductor layer 140, and two openings 165 are respectively formed between the metal pattering layer 160c and the source 160a, as well as the metal pattering layer 160c and the drain 160b to expose portions of the metal oxide semiconductor layer 145, which has higher oxygen vacancy density. The method of patterning the metal layer 160 comprises photolithography and etching. The method of etching the metal layer can be wet etching or dry etching.

Taking Al for example, the etching solution used in the wet etching can be a mixing solution of $H_3PO_4$, $CH_3COOH$, and $HNO_3$. The reacting gas of the dry etching can be a mixing gas of $BCl_3$ and $Cl_2$. The wet etching solution of other metal can be various acid solutions, such as $H_3PO_4$ solution, HCl solution, $H_2C_2O_4$ solution, $H_2O_2$ solution, or any combinations thereof. The reacting gas of the dry etching for other metals can be $BCl_3$, $Cl_2$, $SF_6$, $CF_4$, $CCl_4$, $H_2$, or any combinations thereof.

Next, a passivation layer 170 is formed to cover the source 160a, the drain 160b, the metal patterning layer 160c, and the metal oxide semiconductor layer 140. The passivation layer 170 can be made from a dielectric material. A common dielectric material has silicon oxide, silicon nitride, titanium oxide, aluminum oxide, or hafnium oxide, for example.

The silicon oxide and silicon nitride above can be formed by plasma enhanced chemical vapor deposition (PECVD), sputtering, electron beam evaporation, atomic layer deposition (ALD), or thermal evaporation. The titanium oxide layer, aluminum oxide layer and the hafnium oxide layer above can be formed by sputtering, electron beam evaporation, atomic layer deposition, or thermal evaporation.

In FIG. 1B, no matter the etching solution or the etching plasma of etching the metal layer 160, or the plasma, heat or other "high energy" factor of depositing the passivation layer 170, all can increase the oxygen vacancy density of the exposed metal oxide semiconductor layer 145 to increase the conductivity of the metal oxide semiconductor layer 145.

Taking the etching plasma or the deposition plasma for example, since the charged species in the plasma have a certain kinetic energy, the oxygen in the exposed metal oxide semiconductor layer 145 can be struck out by the bombarding charged species to increase the oxygen vacancy density of the exposed metal oxide semiconductor layer 145.

In addition, taking the deposition of the passivation layer 170 for example, a hydrogen-rich reacting gas can be used to deposit the passivation layer 170 when the passivation layer 170 is silicon oxide or silicon nitride to increase the oxygen vacancy density of the exposed metal oxide semiconductor layer 145.

Therefore, in this embodiment, the etching process of pattering the metal layer 160 can increase the oxygen vacancy density of the metal oxide semiconductor layer 145 exposed by the openings 165, such that the oxygen vacancy density of the exposed metal oxide semiconductor layer 145 is greater than that of the unexposed metal oxide semiconductor layer 140 and 140a. In another embodiment, a plasma bombarding process can be performed during the formation of the passivation layer 170 to increase the oxygen vacancy density of the exposed metal oxide semiconductor layer 145. Therefore, the oxygen vacancy density of the exposed metal oxide semiconductor layer 145 is greater than that of the unexposed metal oxide semiconductor layer 140 and 140a. Thus, the conductivity of the exposed metal oxide semiconductor layer 145 is higher than the unexposed metal oxide semiconductor layer 140 and 140a.

Accordingly, the exposed metal oxide semiconductor layer 145 can be viewed as an inward extension of the source 160a and the drain 160b to reduce the channel length between the source 160a and the drain 160b. Therefore, the channel length is still about equal to the width of the insulating layer 150. The metal patterning layer 160c located above the metal oxide semiconductor layer 140a, which is the channel of the thin film transistor 100, is made from metal, and thus can be used to isolate metal oxide semiconductor layer 140a from the impact of the outside water and oxygen. Moreover, since metal has a large number of free electrons, the metal can directly reflect light, which is an electromagnetic wave, to effectively prevent the light from penetrating the metal oxide semiconductor layer 140a. Besides, since the metal patterning layer 160c and the conductive metal oxide semiconductor layer 145 are isolated by the insulating layer 145, the metal patterning layer 160c and the conductive metal oxide semiconductor layer 145 are insulated from each other and thus do not have the problem of current leakage.

In addition, the metal oxide semiconductor layer 140 usually needs thermal annealing process to adjust the density and distribution of the oxygen vacancies in the metal oxide semiconductor layer 140 to increase the stability of the metal oxide semiconductor layer 140. Therefore, the thermal annealing process has better to be performed before depositing the passivation layer 170. For example, the thermal annealing process can be performed before patterning the metal layer 160, or between patterning the metal layer and depositing the passivation layer 170.

Since the gate 120 and the metal patterning layer 150 of the thin film transistor 100 are both made from metal, and located respectively below and above the metal oxide semiconductor layer 140a, the metal patterning layer 150 can be a second gate. For example, the gate 120 and the patterned metal layer 150 both can connect to a scanning line of an array of thin film transistors. Another application can be connecting the metal patterning layer 150 to a threshold voltage modulation circuit to immediately change or control the threshold voltage of the thin film transistor 100.

Figure 2:
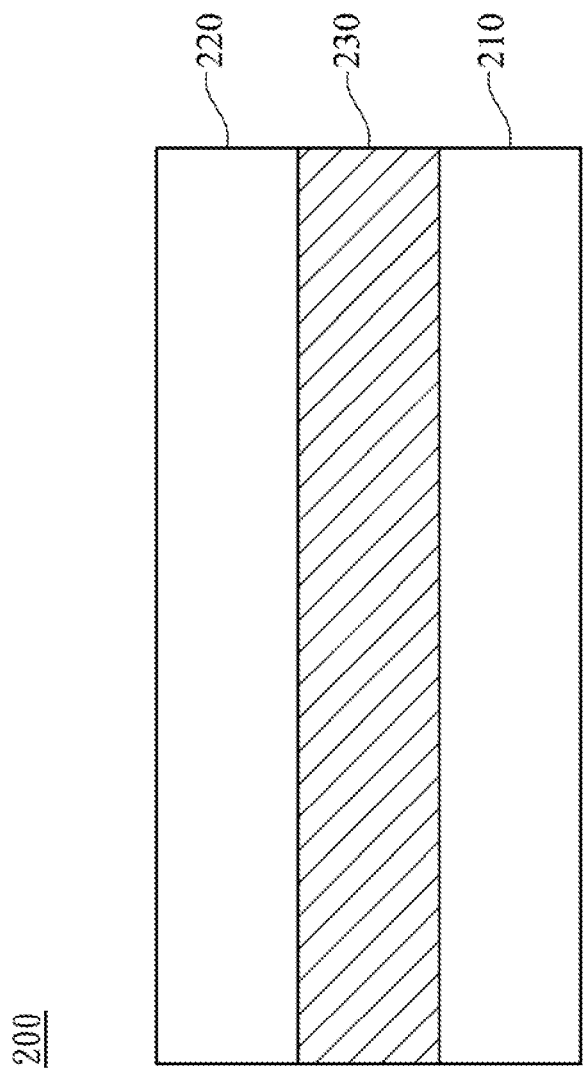
FIG. 2 is a cross-sectional diagram of a display device.

The thin film transistor 100 also can be applied to an array substrate of a display device. FIG. 2 is a cross-sectional diagram of a display device. In FIG. 2, the display device 200 has an array substrate 210, an opposite substrate 220, and a display layer 230 between the array substrate 210 and the opposite substrate 220. The array substrate 210 has an array of the thin film transistor 100 described above, and the opposite substrate 220 is disposed opposite to the array substrate 210. The display layer 230 can be an electronic ink layer, a liquid crystal layer, or a layer of any other available display material.

In light of the foregoing, since a metal material is used to form the metal patterning layer of the metal oxide semiconductor layer of the thin film transistor, the impact of the outside water, oxygen and light to the metal oxide semiconductor can be effectively isolated to maintain the stability of the thin film transistor. Furthermore, since the metal patterning layer is located above the to channel made from the metal oxide semiconductor layer, the metal patterning layer can also be a second gate to inhibit the off current of the thin film transistor or immediately adjust the threshold voltage of the thin film transistor.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A thin film transistor, comprising:
   a gate disposed on a substrate;
   a gate insulating layer disposed on the gate and the substrate;
   a metal oxide semiconductor layer disposed on the gate insulating layer;
   an insulating layer disposed on the metal oxide semiconductor layer;
   a source and a drain respectively disposed on the two sides of the metal oxide semiconductor layer and connecting to the metal oxide semiconductor layer;
   a metal pattering layer disposed on the insulating layer; and
   two openings respectively located between the metal pattering layer and the source as well as the metal pattering layer and the drain to expose portions of the metal oxide semiconductor layer.

2. The thin film transistor of claim 1, wherein the exposed metal oxide semiconductor layer has a higher density of oxygen vacancy than the unexposed metal oxide semiconductor layer.

3. The thin film transistor of claim 1, wherein the exposed metal oxide semiconductor layer has a higher conductivity than the unexposed metal oxide semiconductor layer.

4. The thin film transistor of claim 1, wherein the metal pattering layer is made from a material of Al, Cu, Ti, Mo, or a MoCr alloy.

5. The thin film transistor of claim 1, further comprising a passivation layer covering the source, the drain, the metal patterning layer, and the metal oxide semiconductor layer.

6. A method of fabricating a thin film transistor, the method comprising:
   forming a gate on a substrate;
   forming a gate insulating layer on the gate and the substrate;
   forming a metal oxide semiconductor layer on the gate insulating layer;
   forming an insulating layer on the metal oxide semiconductor layer;
   forming a metal layer covering the metal oxide semiconductor layer and the gate insulating layer; and
   patterning the metal layer to form a source and a drain respectively located on two sides of the metal oxide semiconductor layer, a metal pattering layer on the insulating layer, as well as two openings respectively located between the metal pattering layer and the source as well as the metal pattering layer and the drain to expose portions of the metal oxide semiconductor layer.

7. The method of claim 6, further comprising forming a passivation layer covering the source, the drain, the metal patterning layer, and the metal oxide semiconductor layer.

8. The method of claim 7, further comprising performing a thermal annealing process to treat the metal oxide semiconductor layer between the steps of patterning the metal layer and forming the passivation layer.

9. The method of claim 7, wherein the step of forming the passivation layer comprises performing a plasma bombarding process to increase the density of the oxygen vacancy of the exposed metal semiconductor layer.

10. The method of claim 6, further comprising performing a thermal annealing process to treat the metal oxide layer before patterning the metal layer.

11. The method of claim 6, wherein the step of patterning the metal layer comprises performing an etching process to increase the density of the oxygen vacancy of the exposed metal semiconductor layer.

12. The method of claim 11, wherein the etching process is a wet etching process or a dry etching process.

13. An array substrate, comprising:
    a substrate; and
    a thin film transistor disposed on the substrate, the thin film transistor comprising:
       a gate disposed on a substrate;
       a gate insulating layer disposed on the gate and the substrate;
       a metal oxide semiconductor layer disposed on the gate insulating layer;
       an insulating layer disposed on the metal oxide semiconductor layer;
       a source and a drain respectively disposed on the two sides of the metal oxide semiconductor layer and connecting to the metal oxide semiconductor layer;
       a metal pattering layer disposed on the insulating layer; and
       two openings respectively located between the metal pattering layer and the source as well as the metal pattering layer and the drain to expose portions of the metal oxide semiconductor layer.

14. The array substrate of claim 13, wherein the exposed metal oxide semiconductor layer has a higher density of oxygen vacancy than the unexposed metal oxide semiconductor layer.

15. The array substrate of claim 13, wherein the exposed metal oxide semiconductor layer has a higher conductivity than the unexposed metal oxide semiconductor layer.

16. The array substrate of claim 13, further comprising a passivation layer covering the thin film transistor.

17. A display device, comprising:
    an array substrate, comprising:
       a substrate; and a thin film transistor disposed on the substrate, the thin film transistor comprising:
- a gate disposed on a substrate;
- a gate insulating layer disposed on the gate and the substrate;
- a metal oxide semiconductor layer disposed on the gate insulating layer;
- an insulating layer disposed on the metal oxide semiconductor layer;
- a source and a drain respectively disposed on the two sides of the metal oxide semiconductor layer and connecting to the metal oxide semiconductor layer;
- a metal pattering layer disposed on the insulating layer; and
- two openings respectively located between the metal pattering layer and the source as well as the metal pattering layer and the drain to expose portions of the metal oxide semiconductor layer;

an opposite substrate disposed opposite to the array substrate; and a display layer disposed between the array substrate and the opposite substrate.

18. The display device of the claim 17, wherein the exposed metal oxide semiconductor layer has a higher density of oxygen vacancy than the unexposed metal oxide semiconductor layer.

19. The display device of the claim 17, wherein the exposed metal oxide semiconductor layer has a higher conductivity than the unexposed metal oxide semiconductor layer.

20. The display device of the claim 17, wherein the array substrate comprises a passivation layer covering the thin film transistor.

\* \* \* \* \*